United States Patent
Sawayanagi et al.

(10) Patent No.: US 6,565,377 B2
(45) Date of Patent: May 20, 2003

(54) ELECTRIC CONNECTING TERMINAL

(75) Inventors: Masahiro Sawayanagi, Shizuoka (JP); Yasumichi Kuwayama, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 0 days.

(21) Appl. No.: 09/910,788

(22) Filed: Jul. 24, 2001

(65) Prior Publication Data
US 2002/0013082 A1 Jan. 31, 2002

(30) Foreign Application Priority Data
Jul. 24, 2000 (JP) ......................................... 2000-222695

(51) Int. Cl.$^7$ ............................................... H01R 11/20
(52) U.S. Cl. ......................................... 439/422; 439/877
(58) Field of Search ............................... 439/422, 423, 439/424, 877

(56) References Cited

U.S. PATENT DOCUMENTS 5,611,709 A * 3/1997 McAnulty .................. 439/422
6,394,836 B2 * 5/2002 Nagai ....................... 439/422

FOREIGN PATENT DOCUMENTS

JP 11-144780 5/1999

* cited by examiner

Primary Examiner—Renee Luebke
Assistant Examiner—Ann M McCamey
(74) Attorney, Agent, or Firm—Sughrue Mion, PLLC

(57) ABSTRACT

In an electric connecting terminal (21), a plane portion (23), two pairs of piercing portions (25, 26) erected on both side edges at the base end side of the plane portion (23) and a terminal connecting portion (28) formed on the tip side of the plane portion (23) are provided integrally. The electric connecting terminal (21) is connected to a flat circuit body (1) by inverting the tip of the piercing portion (26) penetrating through a coating (5) and a conductor (4a) in the flat circuit body (1) toward the plane portion (23) side to pierce the conductor (4a) again and superposing the tip of the piercing portion (25) on the tip of the piercing portion (26) to be energized in the direction of the plane portion (23).

4 Claims, 7 Drawing Sheets

ELECTRIC CONNECTING TERMINAL

BACKGROUND OF THE INVENTION

1. Technical Field of the Invention

The present invention relates to an improvement in an electric connecting terminal, in which tips of at least one pair of piercing portions erected on both side edges of a plane portion of the electric connecting terminal penetrate through a coating and a conductor in a flat circuit body and then the tips is fold in such a direction as to approach each other, thereby connecting the electric connecting terminal to the flat circuit body.

2. Related Art

FIG. 9 shows a flat circuit body 1 and a related electric connecting terminal 2 to be connected to the flat circuit body 1.

The flat circuit body 1 is an FFC (flexible flat cable) which is finished to be a band-shaped cable having a flexibility as a whole by coating a plurality of elongated thin-plate shaped conductors 4a, 4b, . . . with a thin film-shaped insulating coating 5. The conductors 4a, 4b, . . . are formed by various manufacturing methods, for example, are formed by pattern printing or by sticking a preformed tape-like conductive material onto an insulating sheet.

The electric connecting terminal 2 is disclosed in JP-A-11-144780, for example, and has such a structure that a plane portion 6, a plurality of pairs of piercing portions 7 and 8 erected from opposite side edges at the base end side of the plane portion 6 and a terminal connecting portion (not shown) formed on the tip side of the plane portion 6 are integrally provided.

The terminal connecting portion (not shown) is to be connected to another connecting terminal and, for example, is formed to have a female terminal structure to be accommodated and held in a connector housing or a male terminal structure.

The electric connecting terminal 2 is a so-called piercing terminal. The tips of the piercing portions 7 and 8 provided on opposite side edges of the plane portion 6 penetrate through the coating 5 and the conductor 4a (4b) in the flat circuit body 1 and are then folded in such a direction as to approach each other as shown in FIG. 10. Therefore, the electric connecting terminal 2 is connected to the flat circuit body 1 electrically and mechanically.

Specifically, the conductor 4a (4b) of the flat circuit body 1 can be connected to the electric connecting terminal 2 by causing each of the tips of the piercing portions 7 and 8 to penetrate through the flat circuit body 1 and folding the tip without peeling the flat circuit body 1. Consequently, the number of the processing steps required for the connection can be reduced, so that a work for wiring the flat circuit body 1 can be carried out at a lower cost.

However, as shown in FIG. 10 in the electric connecting terminal 2, each pair of the piercing portions 7 and 8 is formed so as to individually have a dimension L1 required for folding the piercing portions 7 and 8 and have a clearance L2 required for avoiding an interference between the piercing portions 7 and 8 during the folding operation. Therefore an occupied width L3 in the flat circuit body 1 of one electric connecting terminal 2 becomes great.

As a result, an array pitch $P_1$ of the conductors 4a, 4b, . . . on the flat circuit body 1 is increased. Thus, there is a problem in that the size of the flat circuit body 1 is increased.

Moreover, in the electric connecting terminal 2, the tip portions of the piercing portions 7 and 8 which are folded are returned by a spring back as shown in an arrow A of FIG. 11. As a result, there is a possibility that the fixation of the electric connecting terminal 2 to the flat circuit body 1 maybe slackened and conducting reliability may be deteriorated due to the generation of looseness.

In order to prevent the conducting reliability from being deteriorated due to such a spring back, there is proposed such a double piercing structure that a convex portion (indent) 10 for pushing up the flat circuit body 1 is provided on the center of the plane portion 6 of the electric connecting terminal 2, through holes 11 and 12 capable of inserting the tips of the piercing portions 7 and 8 are provided on opposite sides of the convex portion 10, and the tips of the piercing portions 7 and 8 are caused to penetrate through the flat circuit body 1 again when the piercing portions 7 and 8 penetrating through the flat circuit body 1 are to be folded.

Such a countermeasure can reduce the looseness caused by the spring back, thereby preventing the conducting reliability from being deteriorated. However, on the other hand, the clearance L2 to be maintained between the piercing portions 7 and 8 is further increased due to the double piercing process of the piercing portions 7 and 8. As a result, there is a problem in that the array pitch P1 of the conductor in the flat circuit body 1 is further increased and the size of the flat circuit body 1 is enlarged still more.

SUMMARY OF THE INVENTION

The invention has an object to solve the problems and to provide an excellent electric connecting terminal capable of enhancing conducting reliability for a flat circuit body and of reducing the width of the flat circuit body.

The object of the invention is achieved by an electric connecting terminal to be connected to a flat circuit body comprising:

a plane portion; and a pair of piercing portions having tips erected from opposite side edges of the plane portion, wherein the tips penetrate through a coating and a conductor of the flat circuit body and is folded in such a direction as to approach each other, and wherein one of the tips penetrating through the flat circuit body is inverted toward the plane portion to pierce the conductor and the other tip is superposed on the one of the tips for urging the one of the tips toward the plane portion.

According to the structure, when a pair of piercing portions to pierce the flat circuit body are to penetrate through the flat circuit body and to be folded, the tip of one of the piercing portions is superposed on that of the other piercing portion. Therefore, only the occupied width of almost one of the piercing portions is enough for the occupied width of the piercing portions.

As compared with a conventional electric connecting terminal in which the piercing portions individually require the occupied widths and a clearance is to be provided between the piercing portions, the occupied width on the flat circuit body of one electric connecting terminal can be reduced considerably and the array pitch of the conductor on the flat circuit body can be reduced.

Moreover, the tip of one of the piercing portions to be folded earlier after penetrating through the flat circuit body is brought into such a state as to pierce the conductor of the flat circuit body again and is pressed by the tip of the other piercing portion. Therefore, it is possible to control the spring back of one of the piercing portions through the tip of the other piercing portion.

Thus, the fixation of the electric connecting terminal to the flat circuit body can be prevented from being loosened by the spring back and the conducting reliability for the flat circuit body can also be enhanced.

It is preferable that the plane portion should be provided with an embossed convex portion protruded toward the flat circuit body.

In this case, the flat circuit body provided on the embossed convex portion is brought into such a state as to be lifted up toward the tip of one of the piercing portions which are folded.

Therefore, the tip of one of the piercing portions which is inverted toward the plane portion side and is caused to pierce the conductor again can pierce the conductor easily in a smaller folding amount than that in the case in which the plane portion is flat.

Moreover, the embossed convex portion applies bending deformation to the conductor of the flat circuit body. Consequently, the shear plane of the conductor is pushed against the penetrating portion of each of the piercing portions so that a contact load can be increased.

Thus, the conducting reliability for the flat circuit body can further be enhanced.

DETAILED DESCRIPTION OF PREFERRED EMBODIMENT

An electric connecting terminal according to an embodiment of the invention will be described below in detail with reference to the accompanying drawings.

Figure 1:
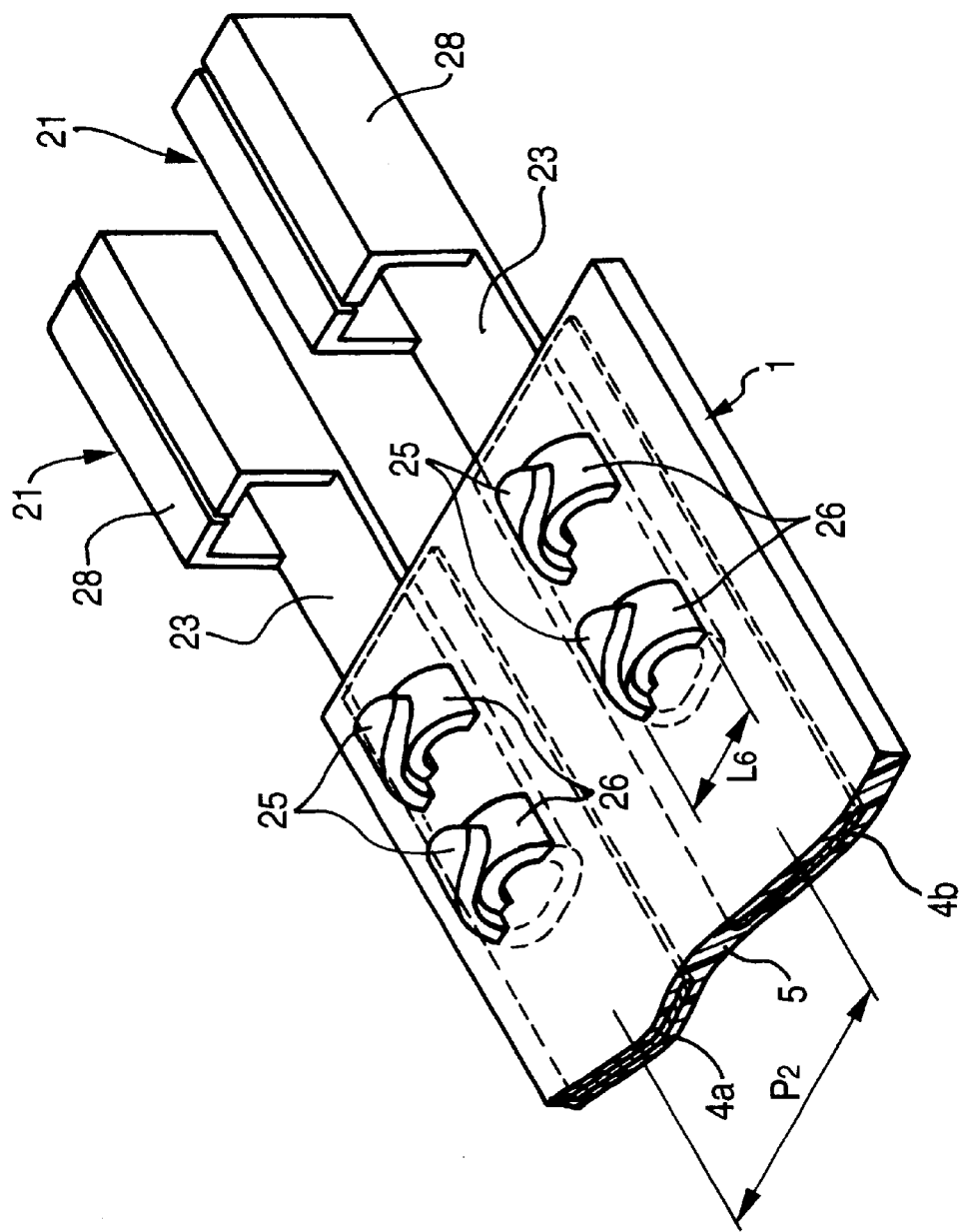
FIG. 1 is a perspective view showing a state in which an electric connecting terminal according to an embodiment of the invention is attached to an end of a flat circuit body.
Figure 2:
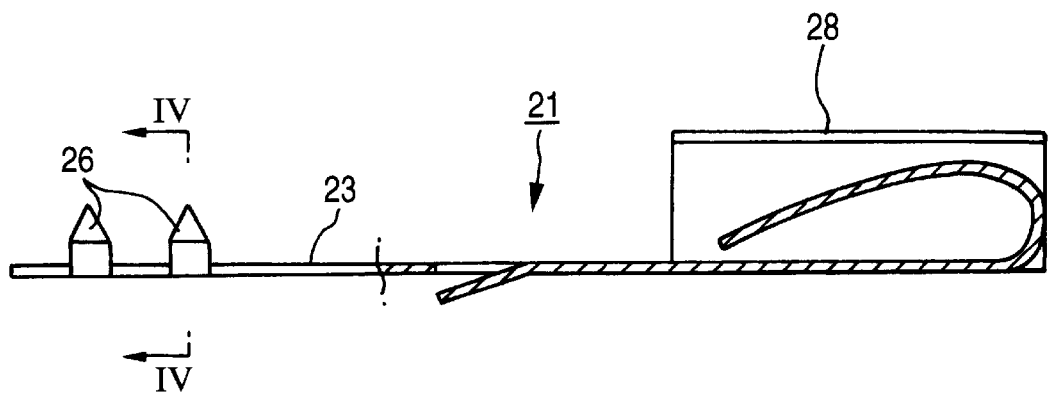
FIG. 2 is a side view showing the electric connecting terminal illustrated in FIG. 1 which is partially taken away.
Figure 3:
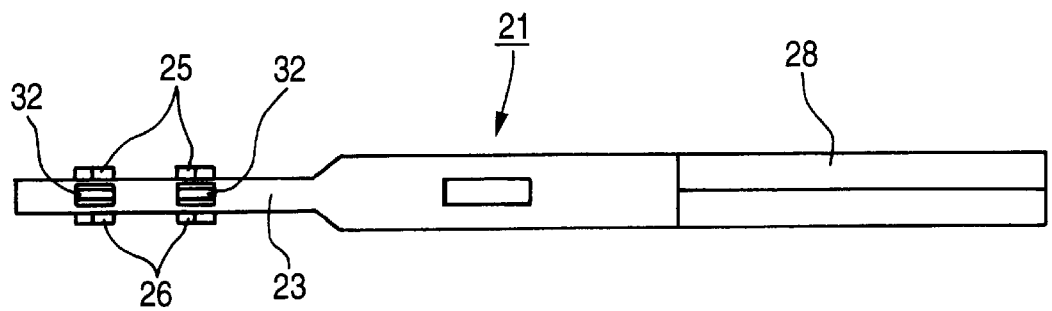
FIG. 3 is a top view showing the electric connecting terminal illustrated in FIG. 1.
Figure 4:
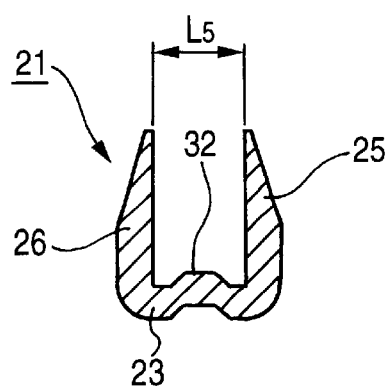
FIG. 4 is a sectional view taken along IV—IV in FIG. 2.
Figure 5:
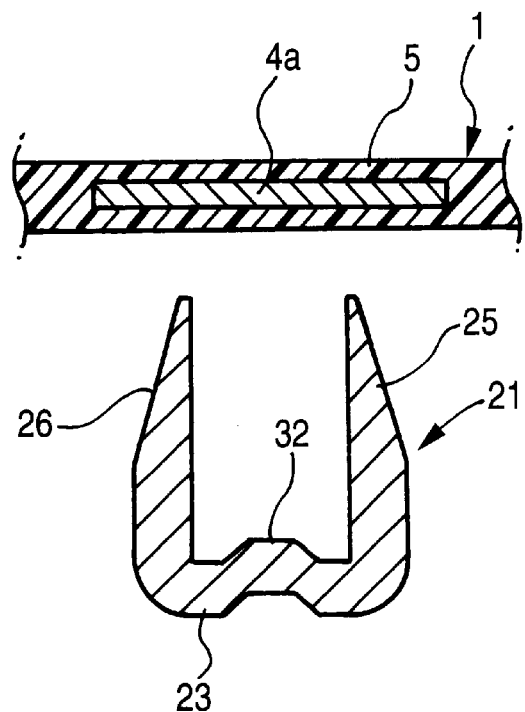
FIG. 5 is a sectional view illustrating a procedure for connecting the electric connecting terminal shown in FIG. 1 to the flat circuit body.
Figure 6:
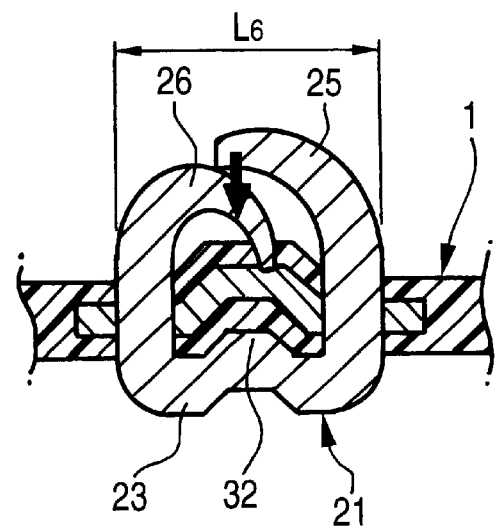
FIG. 6 is a sectional view illustrating the procedure for connecting the electric connecting terminal shown in FIG. 1 to the flat circuit body.
Figure 7:
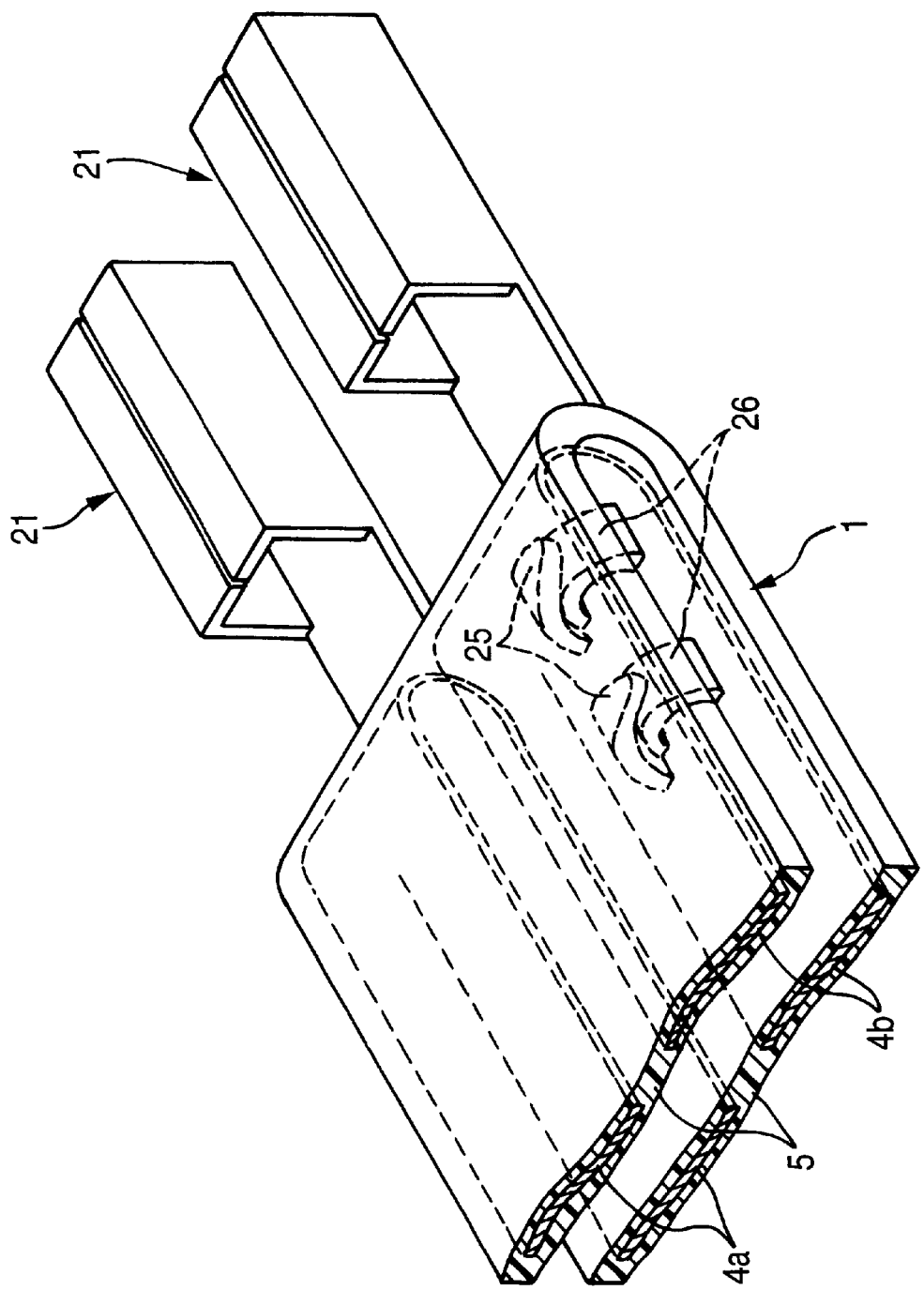
FIG. 7 is an enlarged view showing a main part of a state in which the electric connecting terminal illustrated in FIG. 1 is attached to the middle of the flat circuit body in a longitudinal direction.
Figure 8:
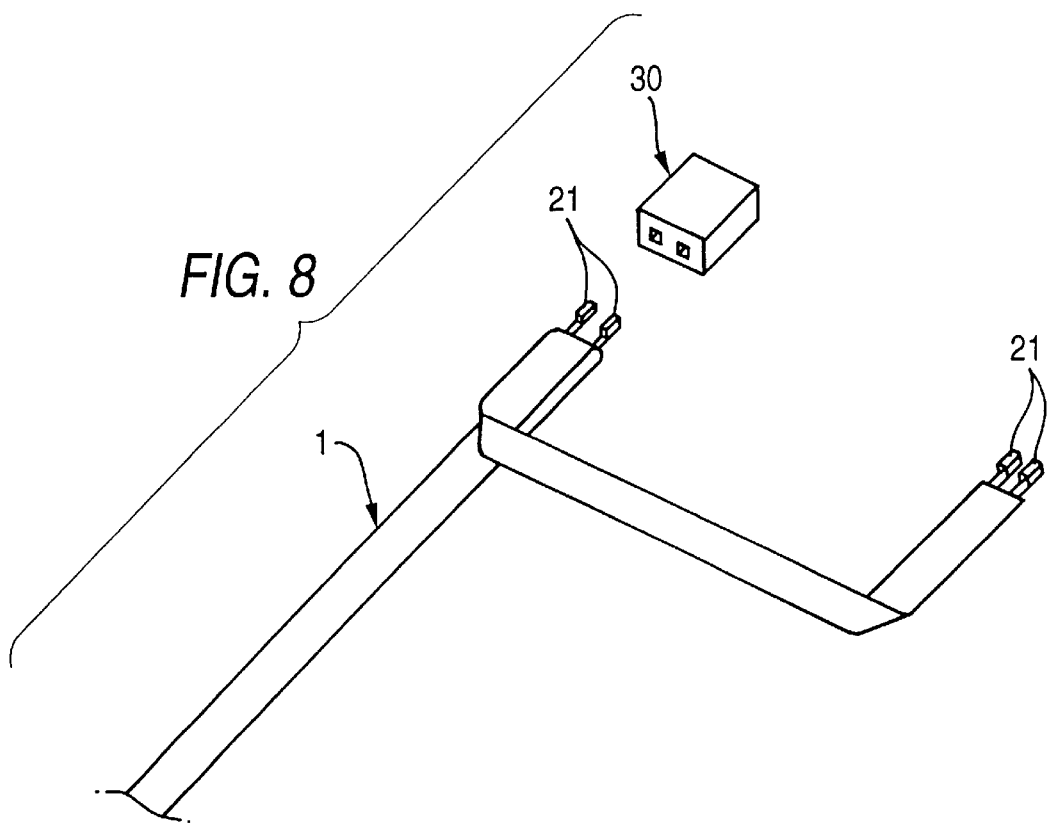
FIG. 8 is a schematic view generally showing the state in which the electric connecting terminal illustrated in FIG. 1 is attached to the middle of the flat circuit body in the longitudinal direction.

FIG. 1 is a perspective view showing a state in which an electric connecting terminal according to an embodiment of the invention is attached to an end of a flat circuit body, FIG. 2 is a side view showing the electric connecting terminal illustrated in FIG. 1 which is partially taken away, FIG. 3 is a top view showing the electric connecting terminal illustrated in FIG. 1, FIG. 4 is a sectional view taken along IV—IV in FIG. 2, FIGS. 5 and 6 are sectional views illustrating a procedure for connecting the electric connecting terminal shown in FIG. 1 to the flat circuit body, and FIGS. 7 and 8 are an enlarged view and a schematic view, mainly and generally showing a state in which the electric connecting terminal illustrated in FIG. 1 is attached to the middle of the flat circuit body in a longitudinal direction.

Figure 9:
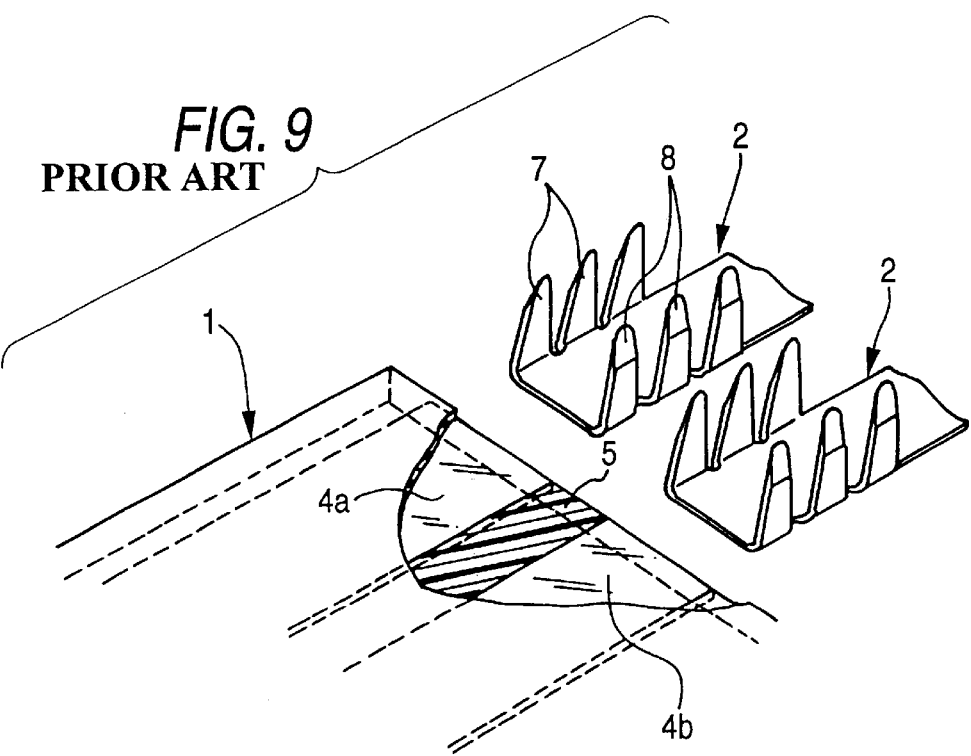
FIG. 9 is a perspective view showing a related electric connecting terminal to be connected to a flat circuit body.

A flat circuit body 1 for connecting an electric connecting terminal 21 according to the embodiment has the same structure as that of the flat circuit body 1 shown in FIG. 9 and is an FFC (flexible flat cable) which is finished to be a band-shaped cable having a flexibility as a whole by coating a plurality of elongated thin-plate shaped conductors 4a, 4b, . . . with a thin film-shaped insulating coating 5. An FPC (flexible printed board) having a conductor formed by pattern printing can also be used for the flat circuit body according to the invention.

The electric connecting terminal 21 according to the embodiment has such a structure that a plane portion 23, two pairs of piercing portions 25 and 26 erected from opposite side edges at the base end side (left side in FIG. 2) of the plane portion 23 and a terminal connecting portion 28 which is formed on the tip side (right side in FIG. 2) of the plane portion 23 are integrally formed of a conductive metal plate as shown in FIGS. 1 to 4. The plane portion 23 is provided with an embossed convex portion (indent) 32 protruded toward the flat circuit body 1.

In the case of the embodiment, the terminal connecting portion 28 is a female type terminal to be fitted and connected into another connecting terminal, and is accommodated and held in a connector housing 30 to be connected to another connecting terminal through the fitting of connectors as shown in FIG. 8. As a matter of course, the terminal connecting portion 28 can also be constituted by a male type terminal.

As shown in FIG. 1, the electric connecting terminal 21 is a so-called piercing terminal to be connected to the flat circuit body 1 by causing tips of the piercing portions 25 and 26 as a pair to penetrate through the coating 5 and the conductor 4a (4b) in the flat circuit body 1 and then folding the tips in such a direction as to approach each other.

Moreover, as shown in FIG. 4, a space L5 between the piercing portions 25 and 26 as a pair in the electric connecting terminal 21 is set to be smaller than a space between the piercing portions 7 and 8 in the related electric connecting terminal 2 shown in FIG. 9.

As shown in FIGS. 5 and 6, the tip of the piercing portion 26 penetrating through the coating 5 and the conductor 4a in the flat circuit body 1 is inverted toward the plane portion 23 side and is caused to pierce the conductor 4a again. The tip of one of the piercing portion 25 is superposed on the tip of the other piercing portion 26 for urging the tip of the other piercing portion 26 in the direction of the plane portion 23. Thus, the electric connecting terminal 21 is connected to the flat circuit body 1.

More specifically, according to the electric connecting terminal 21 in accordance with the invention, when a pair of piercing portions 25 and 26 for piercing the flat circuit body 1 penetrate through the flat circuit body 1 and is folded, the tip of the piercing portion 25 is superposed on that of the other piercing portion 26. Therefore, the occupied width of almost the piercing portion 26 is enough for an occupied width L6 of the piercing portions as shown in FIG. 6. Therefore, an occupied width L6 of the both piercing portions can be defined as the approximately occupied width of one piercing portion 26 as shown in FIG. 6. That is, the occupied width of one piercing portions is enough for forming the piercing portions 25 and 26 having the occupied width L6.

Figure 10:
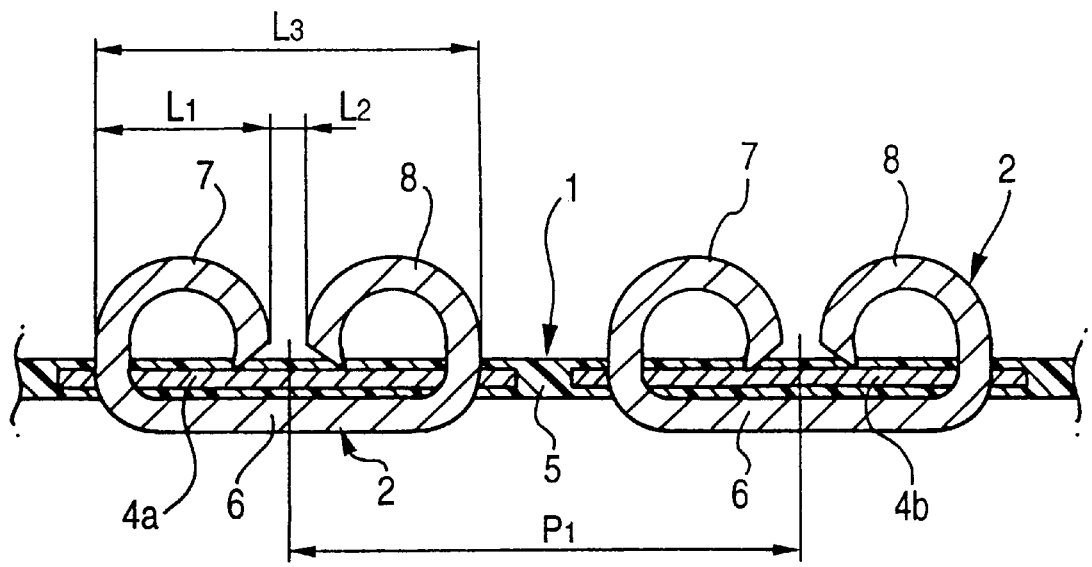
FIG. 10 is a cross-sectional view showing a connecting portion of the electric connecting terminal illustrated in FIG. 9 to the flat circuit body.
Figure 11:
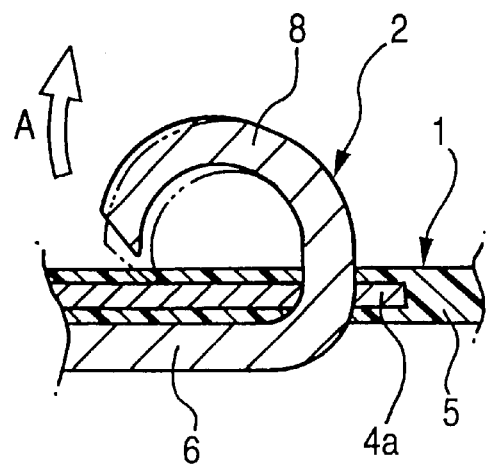
FIG. 11 is a sectional view showing a main part of a spring back of a piercing portion in the electric connecting terminal illustrated in FIG. 9.
Figure 12:
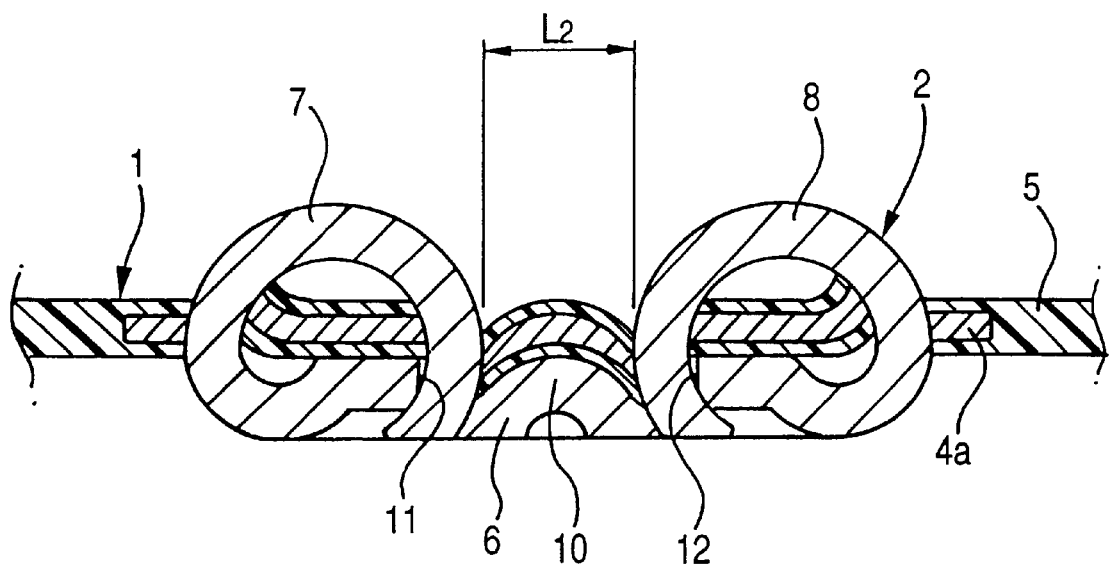
FIG. 12 is a cross-sectional view showing a connecting portion of another conventional electric connecting terminal to a flat circuit body.

As compared with the related electric connecting terminal 2 in which a pair of piercing portions 7 and 8 individually require an occupied width L1 respectively and a clearance L2 should be provided between the piercing portions 7 and 8 as shown in FIG. 10, the electric connecting terminal 21 in accordance with the embodiment can considerably reduce the occupied width L6 on the flat circuit body 1 of one electric connecting terminal 21 and an array pitch P2 of the conductors 4a, 4b . . . on the flat circuit body 1 can be reduced. Therefore, the width of the flat circuit body 1 can be reduced.

Moreover, after the tip of the piercing portion 26 penetrates through the flat circuit body 1, the tip of the piercing portion 26 to be folded earlier is brought into such a state as to pierce the conductor 4a (4b) of the flat circuit body 1 again and is pressed by the tip of the other piercing portion 25. Therefore, it is possible to control the spring back of the piercing portion 26 through the tip of the other piercing portion 25.

The fixation of the electric connecting terminal 21 to the flat circuit body 1 can be prevented from being loosened due to the spring back, and the conducting reliability for the flat circuit body 1 can also be enhanced.

Moreover, as shown in FIG. 6, the plane portion 23 of the electric connecting terminal 21 according to the embodiment is provided with an embossed convex portion 32 protruded toward the flat circuit body 1.

The flat circuit body 1 provided on the embossed convex portion 32 is brought into such a state as to be lifted up toward the tip of the piercing portion 26 which is folded. Therefore, the tip of the piercing portion 26 to be inverted toward the plane portion 23 side and to pierce the conductor 4a (4b) again can easily pierce the conductor 4a (4b) in a smaller folding amount than that in the case in which the plane portion 23 is flat.

More specifically, a sufficient folding amount is required for causing the tip of the piercing portion 26 inverted toward the plane portion 23 side to pierce the conductor 4a (4b) again. Therefore, there is a possibility that the sufficient folding amount may not be obtained depending on the relationship between the plate thickness of the electric connecting terminal 21 and the occupied width.

To prevent this, the embossed convex portion 32 is formed on the plane portion 23. Therefore, the conductor 4a (4b) can reliably be pierced in a small folding amount, the occupied width can also be set to be smaller and the pitch can further be reduced.

Moreover, the conductor 4a (4b) of the flat circuit body 1 is bent and deformed due to forming the embossed convex portion 32 so that the shear plane of the conductor 4a (4b) is pushed against the penetrating portions of the piercing portions 25 and 26. Consequently, the contact load of the conductor 4a (4b) with each of the piercing portions 25 and 26 can also be increased.

Thus, the conducting reliability for the flat circuit body 1 can further be enhanced.

While two pairs of piercing portions 25 and 26 on the base end side of the plane portion 23 in the electric connecting terminal 21 have been provided in the embodiment, it is sufficient that at least one pair of piercing portions are provided in the invention, and setting is properly carried out in respect of maintenance of a mechanical connecting strength or an electric contact area.

Moreover, the position where the electric connecting terminal 21 is to be attached to the flat circuit body 1 is not restricted to the end of the flat circuit body 1 shown in FIG. 1, it can also be attached to the middle of the flat circuit body 1 in the longitudinal direction to constitute a branch circuit as shown in FIGS. 7 and 8.

According to the electric connecting terminal in accordance with the invention, as described above, when a pair of piercing portions to pierce the flat circuit body are to penetrate through the flat circuit body and to be folded, the tip of one of the piercing portions is superposed on that of the other piercing portion. Therefore, only the occupied width of almost one of the piercing portions is enough for the occupied width of the piercing portions.

As compared with a conventional electric connecting terminal in which the piercing portions individually require the occupied widths and a clearance is to be provided between the piercing portions, the occupied width on the flat circuit body of one electric connecting terminal can be reduced considerably and the array pitch of the conductor on the flat circuit body can be reduced.

Moreover, the tip of one of the piercing portions to be folded earlier after penetrating through the flat circuit body is brought into such a state as to pierce the conductor of the flat circuit body again and is pressed by the tip of the other piercing portion. Therefore, it is possible to control the spring back of one of the piercing portions through the tip of the other piercing portion.

Thus, the fixation of the electric connecting terminal to the flat circuit body can be prevented from being loosened by the spring back and the conducting reliability for the flat circuit body can also be enhanced.

Accordingly, it is possible to provide an excellent electric connecting terminal capable of enhancing the conducting reliability for the flat circuit body and of reducing the width of the flat circuit body.

What is claimed is:

1. An electric connecting terminal to be connected to a flat circuit body comprising:
    a plane portion; and
    a pair of piercing portions having tips erected from opposite side edges of the plane portion,
    wherein the tips penetrate through a coating and a conductor of the flat circuit body a first time and are folded in such a direction as to approach each other, and
    wherein one of the tips penetrating through the flat circuit body is inverted toward the plane portion piercing the conductor a second time, and the other tip is superposed on the one of the tips for urging the one of the tips toward the plane portion.

2. The electric connecting terminal according to claim 1, wherein the plane portion is provided with a convex portion protruded toward the flat circuit body.

3. The electric connecting terminal according to claim 1, wherein the pair of piercing portions is formed at a base end side of the plane portion and a terminal connecting portion is formed at a tip side opposite to the base side of the plane portion.

4. The electric connecting terminal according to claim 3, wherein the plane portion, the pair of piercing portions and the terminal connecting portion is integrally formed of a conductive metal plate.

* * * * *